(12) United States Patent
Hsiung et al.

(10) Patent No.: US 11,169,415 B2
(45) Date of Patent: Nov. 9, 2021

(54) BACKLIGHT DEVICE

(71) Applicant: SITRONIX TECHNOLOGY CORP., Jhubei (TW)

(72) Inventors: Chuan-Pin Hsiung, Jhubei (TW); Shun Wen Cheng, Jhubei (TW)

(73) Assignee: Sitronix Technology Corp., Jhubei (TW)

( * ) Notice: Subject to any disclaimer, the term of this patent is extended or adjusted under 35 U.S.C. 154(b) by 0 days.

(21) Appl. No.: 16/452,867

(22) Filed: Jun. 26, 2019

(65) Prior Publication Data

US 2021/0103189 A1    Apr. 8, 2021

Related U.S. Application Data

(60) Provisional application No. 62/844,847, filed on May 8, 2019, provisional application No. 62/721,694, filed on Aug. 23, 2018, provisional application No. 62/689,930, filed on Jun. 26, 2018.

(51) Int. Cl.
*G02F 1/13357* (2006.01)
*H05K 7/20* (2006.01)

(52) U.S. Cl.
CPC ..... *G02F 1/133615* (2013.01); *H05K 7/2039* (2013.01)

(58) Field of Classification Search
None
See application file for complete search history.

(56) References Cited

FOREIGN PATENT DOCUMENTS

| CN | 106716228 A | 5/2017 |
|---|---|---|
| CN | 106773323 A | 5/2017 |
| CN | 107466377 A | 12/2017 |
| CN | 107643627 A | 1/2018 |
| CN | 206960782 U | 2/2018 |
| CN | 206975364 U | 2/2018 |

*Primary Examiner* — Vip Patel
(74) *Attorney, Agent, or Firm* — Rosenberg, Klein & Lee

(57) ABSTRACT

The invention is related to a back-light device. The back-light device comprises a reflection structure and a back-light plate. A plurality of light-emitting elements, disposed on the back-light plate, face a light-entering side of the reflection structure, and the emitted light of the light-emitting elements enters the light-entering side of the reflection structure and is reflected to a light-emitting side of the reflection structure by the reflection of the reflection structure for forming a back-light source emitted to a display panel.

15 Claims, 20 Drawing Sheets ial diagram of the HUD
BACKLIGHT DEVICE

FIELD OF THE INVENTION

The present invention relates generally to a light source device, and particularly to a back-light device.

BACKGROUND OF THE INVENTION

The size of electronic devices are mostly required to be lightweight and compact. Due to the space and saving power consumption requirements, more spatial limitation and power consumption limitation are imposed on automobile electronics.

Head-up displays (HUDs) are popularized from airplanes to automobiles. To increase driving safety, in addition to the basic simple information such as speed, fuel, and temperature, more safety information, including the distance to car in front, lane departure, and lane change, can be provided to drivers. The information can improve driving safety. Thereby, HUDs have gradually become standard equipment in automobiles.

Given the limited space behind the dashboard of an automobile, the size of an HUD must be as small as possible. Unfortunately, the HUD is the optical apparatus. To shrink the space required for accommodating the optical elements is difficult. The possible way to shrink the size of the HUD relies on back-light and heat dissipation designs.

Accordingly, the present invention provides a back-light device, which adopts a reflection structure to shrink optical transmission space while maintaining optical transmission paths as well as enhancing the performance of producing back-light source.

SUMMARY

An objective of the present invention is to provide a back-light device, which adopts a reflection structure at a location relative to the back-light plate for shrinking the optical transmission space and thus facilitating HUD design.

Another objective of the present invention is to provide a back-light device. By narrowing the light-emitting angle of the rays from the light-emitting elements disposed on the back-light plate, the rays may be concentrated, which may enhance the efficiency of producing back-light source and lower power consumption.

The present invention discloses a back-light device, which comprises a reflection structure and a back-light plate. The reflection structure includes a light-entering side and a light-emitting side. The back-light plate is located on the light-entering side. A plurality of light-emitting elements are disposed on the back-light plate and face the light-entering side. The emitted light of the light-emitting elements are reflected by the reflection structure to the light-emitting side for forming the back-light source.

DETAILED DESCRIPTION

In order to make the structure and characteristics as well as the effectiveness of the present invention to be further understood and recognized, the detailed description of the present invention is provided as follows along with embodiments and accompanying figures.

Since the HUDs according to the prior art are large and occupy substantial space, the present invention provides a back-light device for solving the space problem faced in the prior art.

In the following, the properties and the accompanying structure of the back-light device according to the present invention will be further described.

Figure 1A:
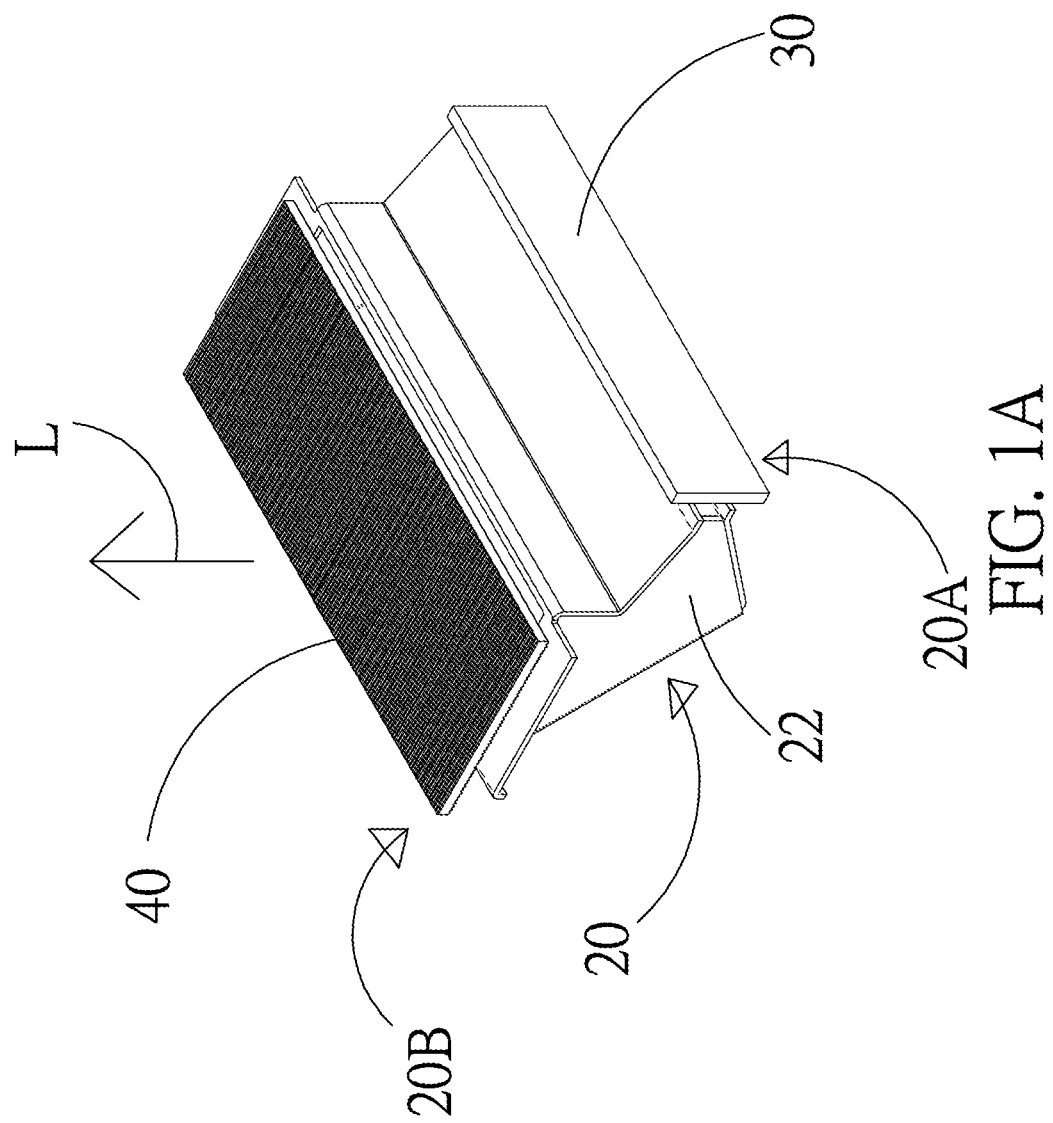
FIG. 1A shows a stereoscopic diagram according to an embodiment of the present invention.
Figure 1B:
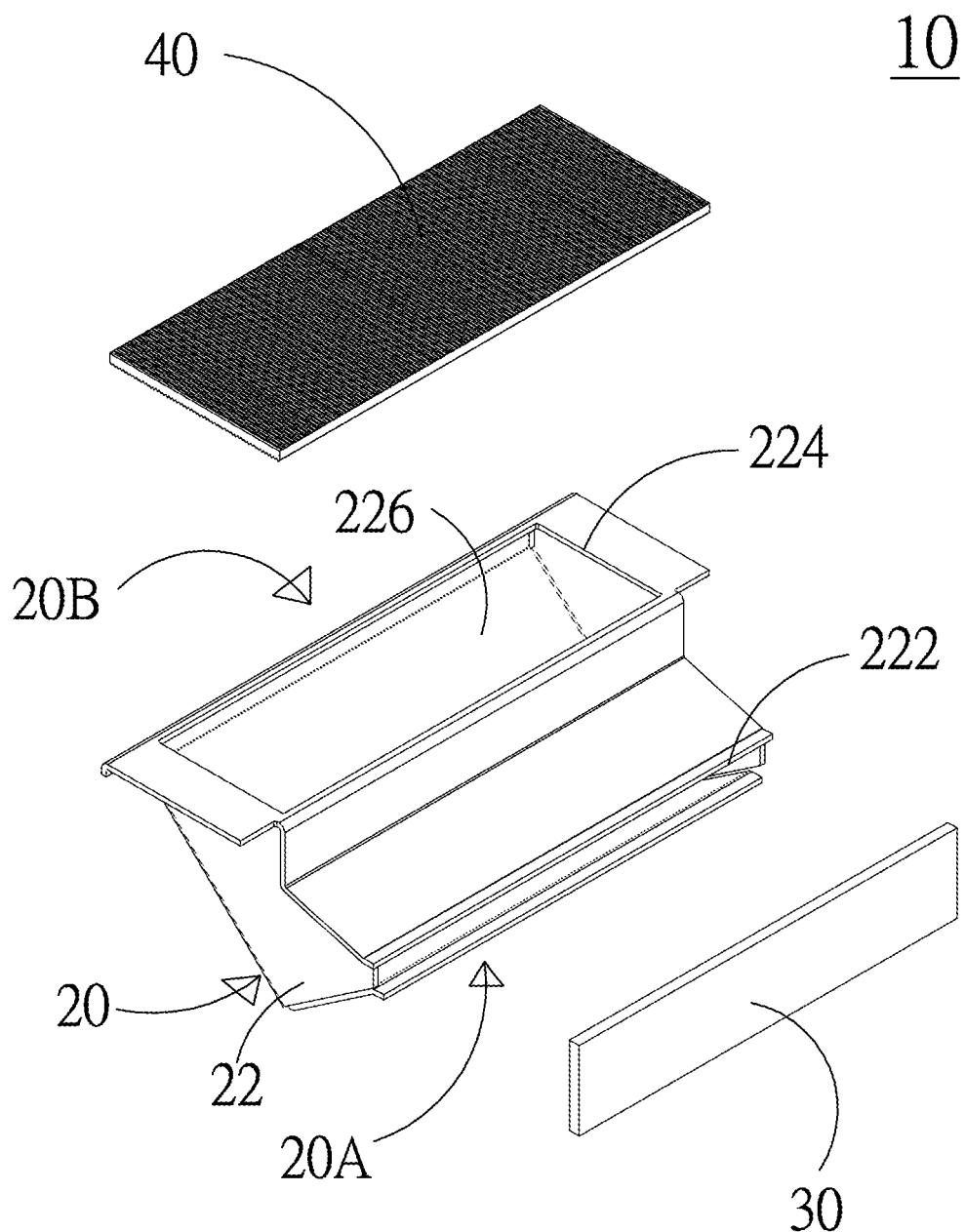
FIG. 1B shows an exploded view according to an embodiment of the present invention.
Figure 1C:
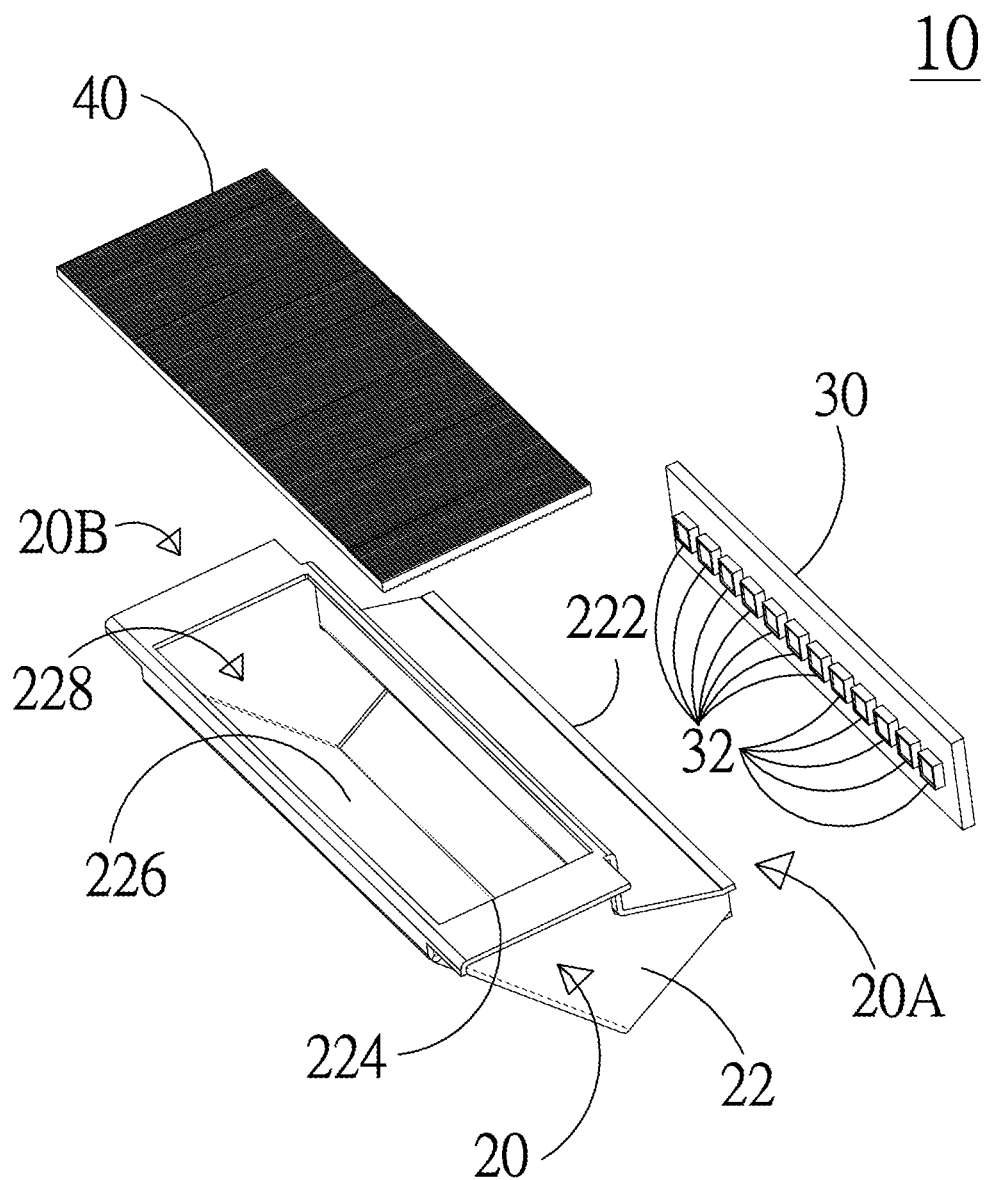
FIG. 1C shows another exploded view according to an embodiment of the present invention.
Figure 2A:
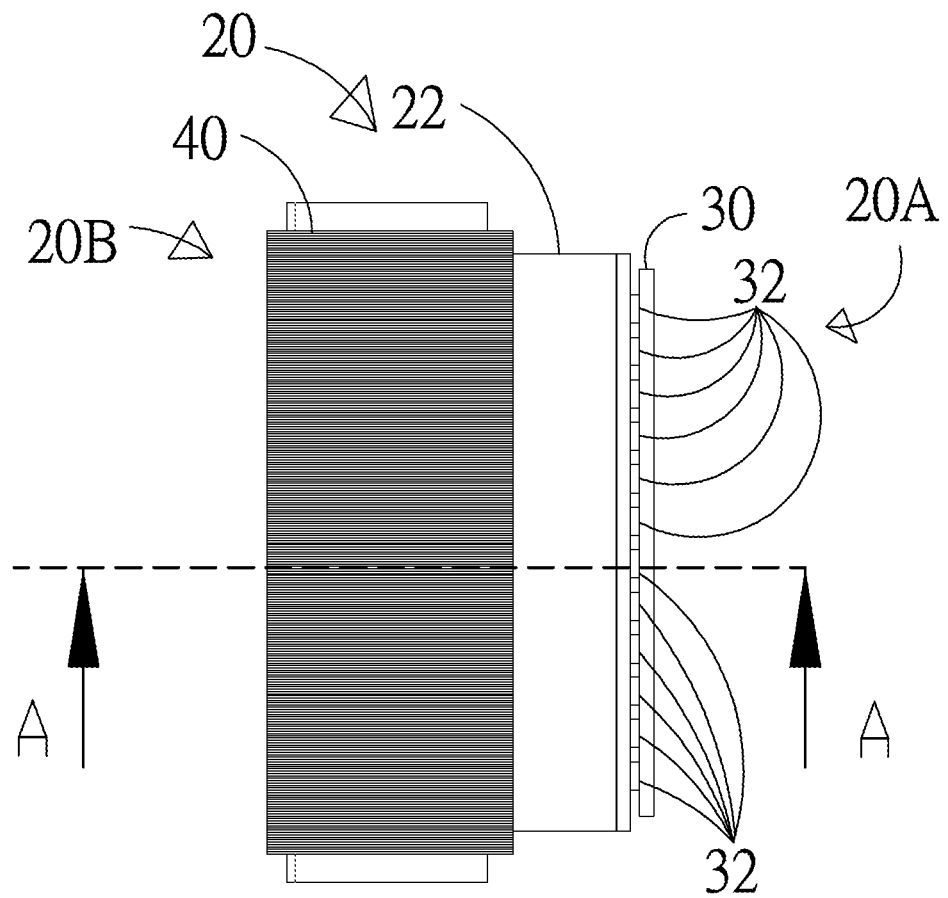
FIG. 2A shows a top view according to an embodiment of the present invention.

First, please refer to FIG. 1A to FIG. 2B, which show a stereoscopic diagram, an exploded view, another exploded view, a top view, and a cross-sectional view along the line AA in FIG. 2A according to an embodiment of the present invention. As shown in FIG. 1A and FIG. 1B, the back-light device 10 according to the present invention comprises a reflection structure 20 and a back-light plate 30. The reflection structure 20 includes a light-entering side 20A and a light-emitting side 20B located in different directions. A plurality of light-emitting elements 32 are disposed in the back-light plate 30. The back-light plate 30 is located on the light-entering side 20A. The light-emitting elements 32 face the light-entering side 20A. The rays emitted by the light-emitting elements 32 are reflected by the reflection structure 20 to the light-emitting side 20B to form a back-light source L (the light emitting direction is used to represent the back-light source L in FIG. 1A) for providing to a display panel. The detailed structure according to the present embodiment is described as follows.

As shown in FIG. 1A to FIG. 1C, the reflection structure 20 includes a light collecting hood 22, which has a light inlet 222 located on the light-entering side 20A and a light outlet 224 located on the light-emitting side 20B. The light collecting hood 22 has a reflection surface 226 and an optical pathway 229 inside the light collecting hood 22. In other words, the reflection surface 226 and the optical pathway 228 are located between the light inlet 222 and the light outlet 224. The reflection surface 226 is opposing to the light inlet 222 and the light outlet 224. The light-emitting elements 32 face the light-entering side 20A. When the back-light plate 30 is disposed at the reflection structure 20, the light-emitting elements 32 are further located at the light inlet 222. Thereby, the rays produced by the light-emitting elements 32 enter the optical pathway 228 of the light collecting hood 22 from the light inlet 222 located on the light-entering side 20A. Then the rays are reflected by the reflection surface 226 to the light outlet 224 and forming the back-light source L. Namely, the reflection surface 226 reflects the rays produced by the light-emitting elements 32 to the light-emitting side 20B. Thereby, the light inlet 222 and the light outlet 224 are not disposed in parallel. Because reflection structure 20 reflects the rays to change the optical path of the rays, which is equivalent to bending the optical path, the light inlet 222 and the light outlet 224 may be disposed unparallelly. Then the light-entering side 20A and the light-emitting side 20B may be located in different directions, enabling shrinkage of the space occupied by the back-light device 10. The back-light device 10 according to the present embodiment may further comprise a light-outlet optical assembly 40 disposed on the light-emitting side 20B. Thereby, the back-light source L emitting from the light outlet 224 will pass through the light-outlet optical assembly 40.

Figure 2B:
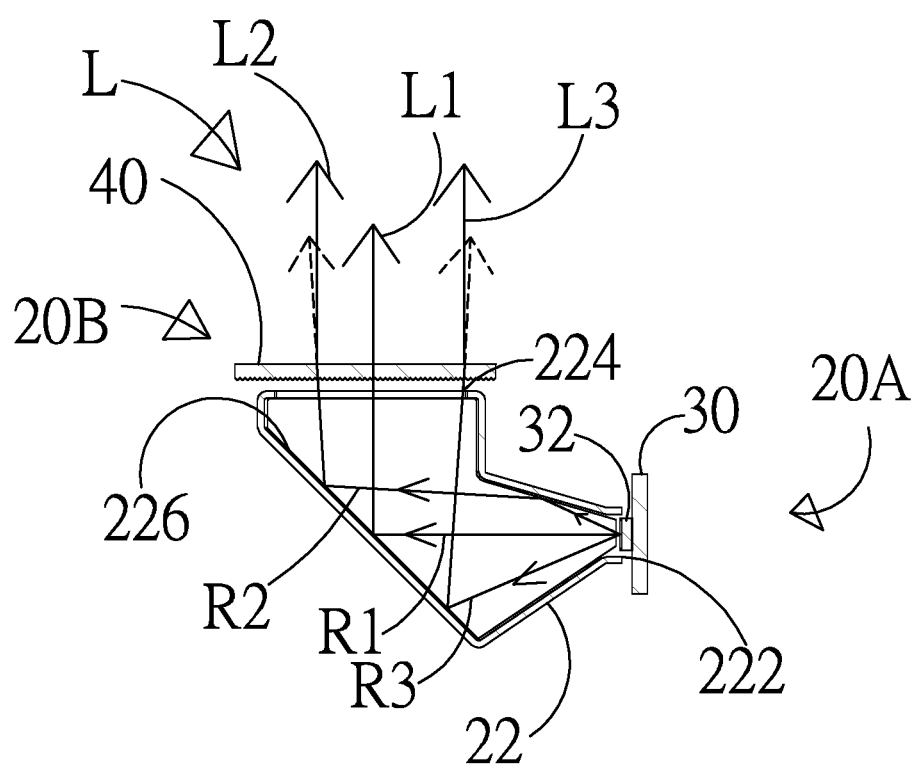
FIG. 2B shows a cross-sectional view along the line AA in FIG. 2A.

As shown in FIG. 2A and FIG. 2B, the first ray R1, the second ray R2, and the third ray R3 produced by the light-emitting elements 32 disposed on the back-light plate 30 enter the optical pathway 228 of the light collecting hood 22 through the light inlet 222 located on the light-entering side 20A. The optical pathway 229 guides the first ray R1, the second ray R2, and the third ray R3 produced by the light-emitting elements 32 to the reflection surface 226 for reflecting the rays R1, R2, R3 to the light outlet 224 located on the light-emitting side 20B for forming the back-light source L. In addition, the light-outlet optical assembly 40 will adjust the optical path of the back-light source L for enhancing luminance and uniformity. The first ray R1, the second ray R2, and the third ray R3 illustrate that the light-emitting angles are around 30 to 120 degrees. The reflection surface 226 may be a reflection mirror or a cylindrical surface. Furthermore, the reflection surface 226 may be a cylindrical mirror for reflecting the first ray R1, the second ray R2, and the third ray R3 of the light-emitting elements 32 to the light-emitting side 20B. The angles of the first ray R1, the second ray R2, and the third ray R3 are adjusted by the light-outlet optical assembly 40 at the light outlet 224 to form the first emitting ray L1, the second emitting ray L2, and the third emitting ray L3. The light-outlet optical assembly 40 includes optical lenses or optical thin films for enhancing luminance and uniformity.

Figure 3A:
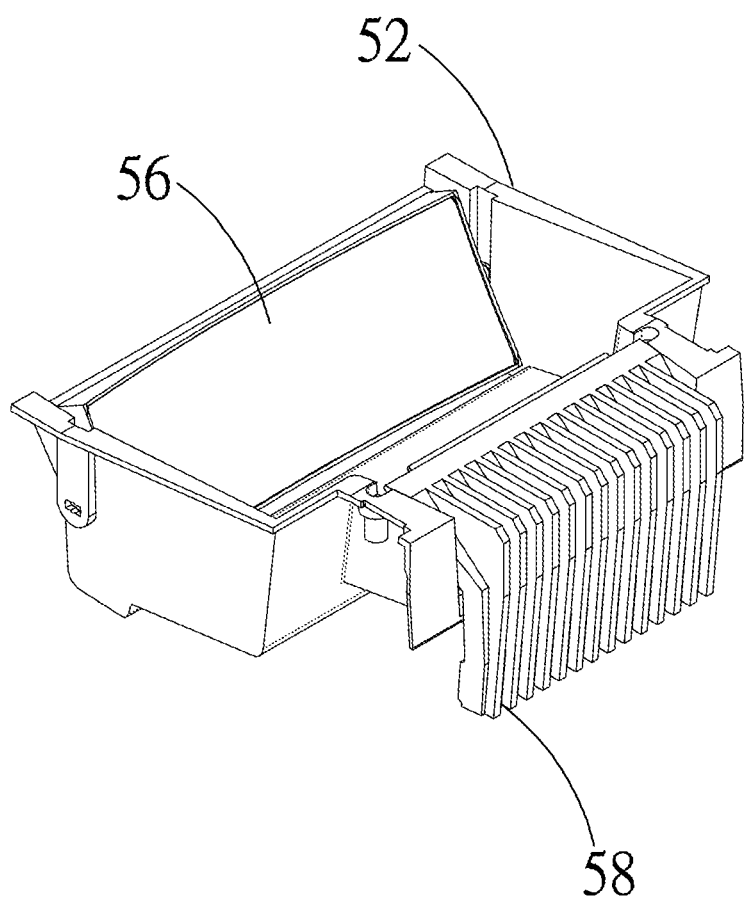
FIG. 3A shows a stereoscopic diagram of the HUD according to an embodiment of the present invention.
Figure 3B:
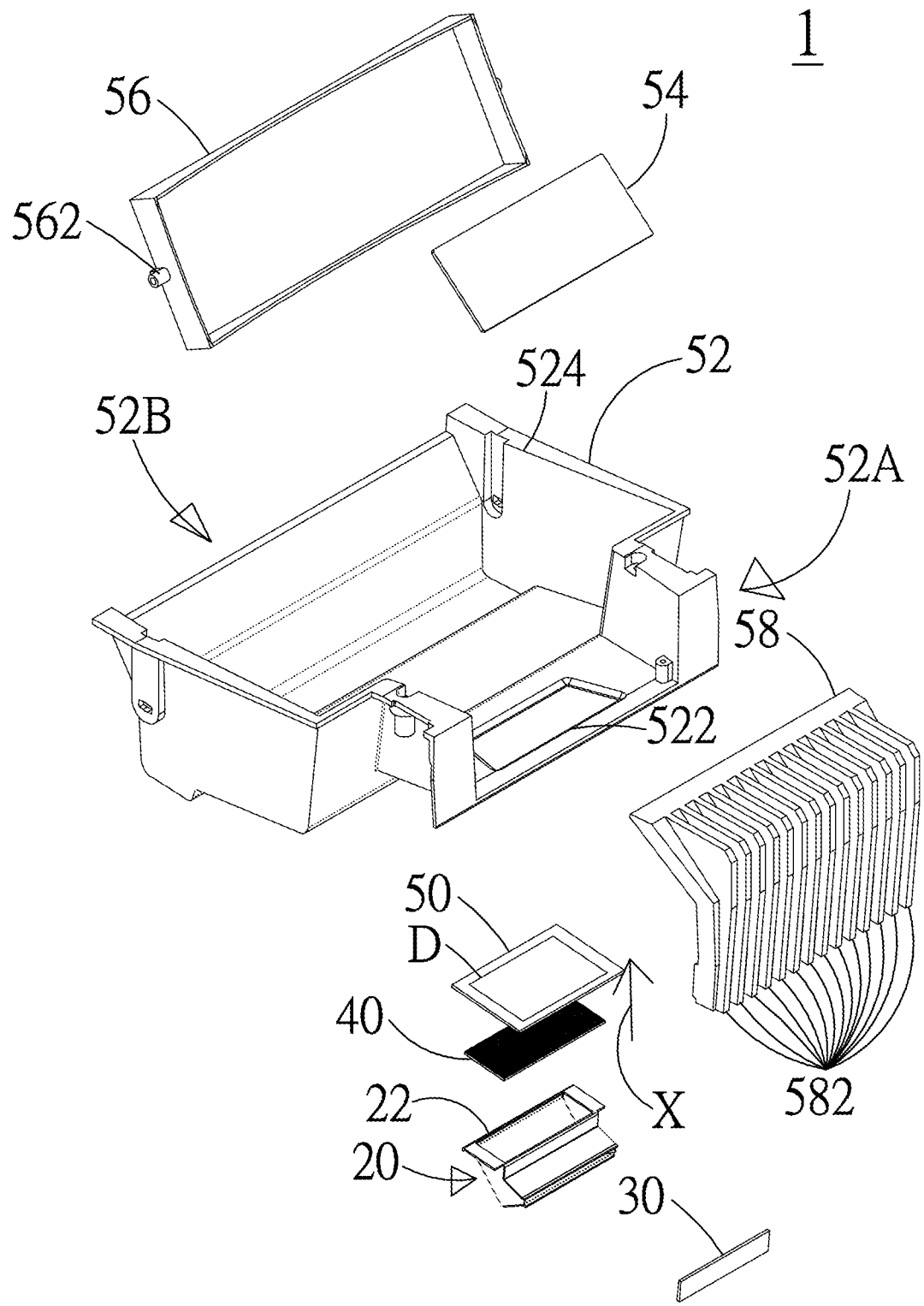
FIG. 3B shows an exploded view of the HUD according to an embodiment of the present invention.
Figure 3C:
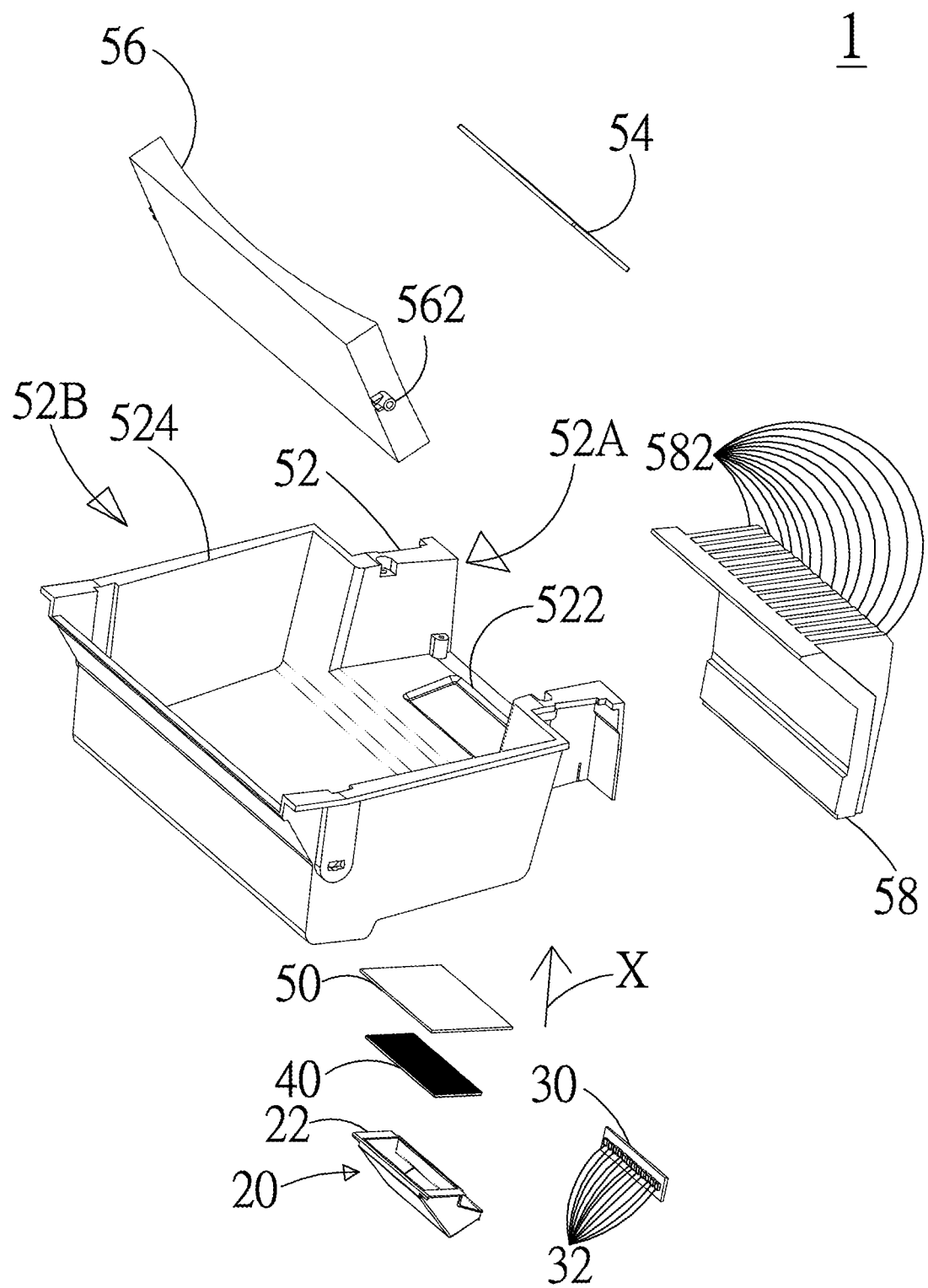
FIG. 3C shows another exploded view of the HUD according to an embodiment of the present invention.
Figure 3D:
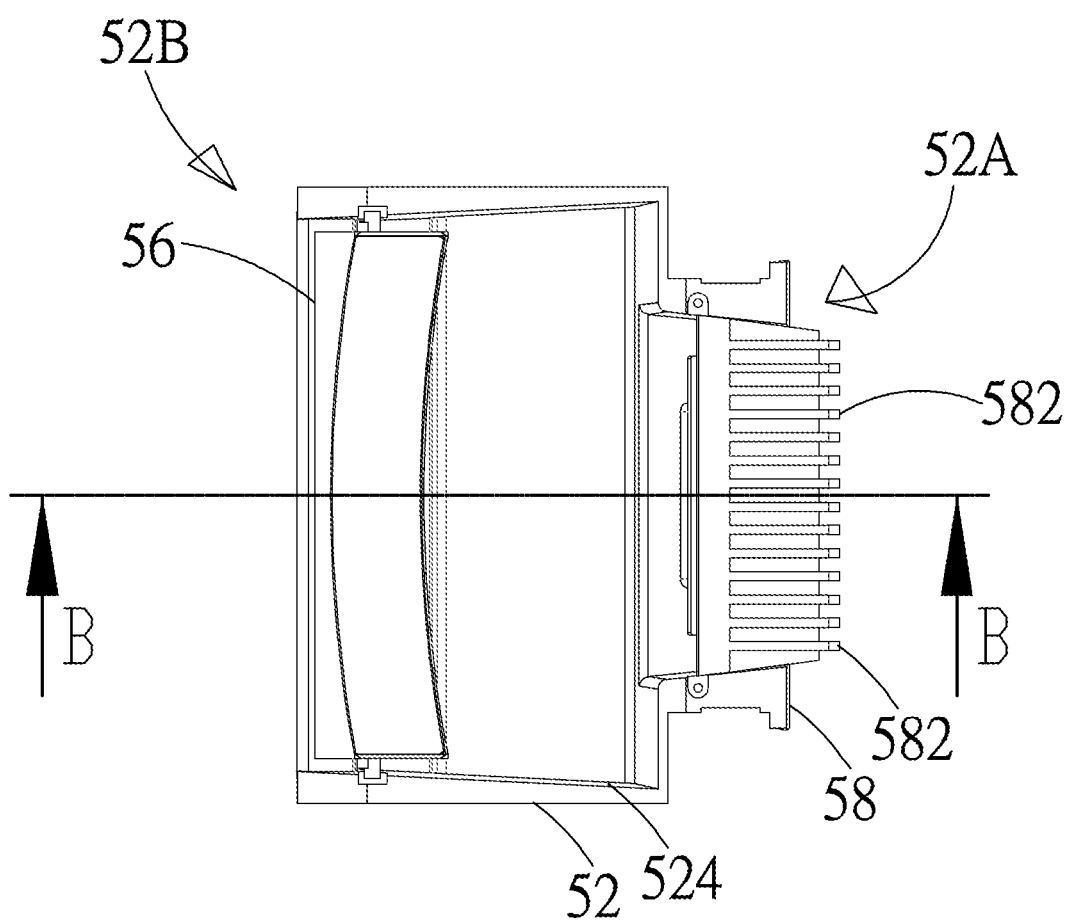
FIG. 3D shows a top view of the HUD according to an embodiment of the present invention.
Figure 3E:
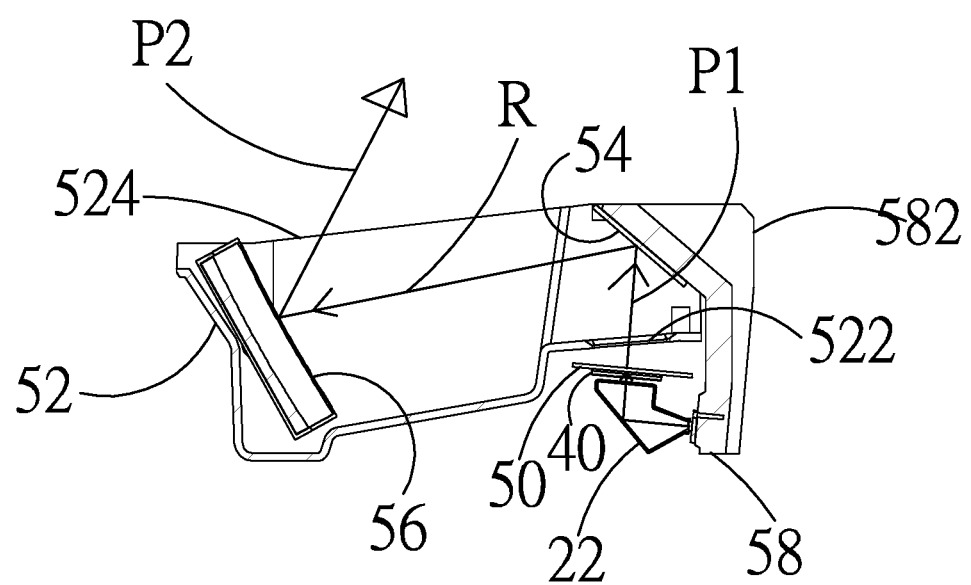
FIG. 3E shows a cross-sectional view along the line BB in FIG. 3D.

As shown in FIG. 3A to FIG. 3E, the back-light device 10 is applied to an optical imaging device 1, for example, an HUD. In addition to the back-light device 10, the optical imaging device 1 further comprises a display panel 50, a housing 52, a reflection mirror 54, and a projection element 56. The display panel 50 is opposing to the light-emitting side 20B of the back-light device 10 and the light-outlet optical assembly 40. In other words, the light-outlet optical assembly 40 is disposed between the display panel 50 and the light outlet 224. The display panel 50 is located below the bottom opening 522 located on a first side 52A of the housing 52. As shown in FIG. 3E, the reflection mirror 54 is opposing to the bottom opening 522 and disposed on the first projection path P1 of the display panel 50. The projection element 56 is disposed on the reflection path R of the reflection mirror 54. The projection element 56 is located on a second side 52B of the housing 52. A projection opening 524 is located on the top of the housing 52. A second projection path P2 of the projection element 56 passes through the projection opening 524, so that the projection element 56 projects images along the second projection path P2. A plurality of connecting members 562 are disposed on the projection element 56 so that the projection element 56 can be connected to the housing 52 through the connecting members 562.

Figure 3F:
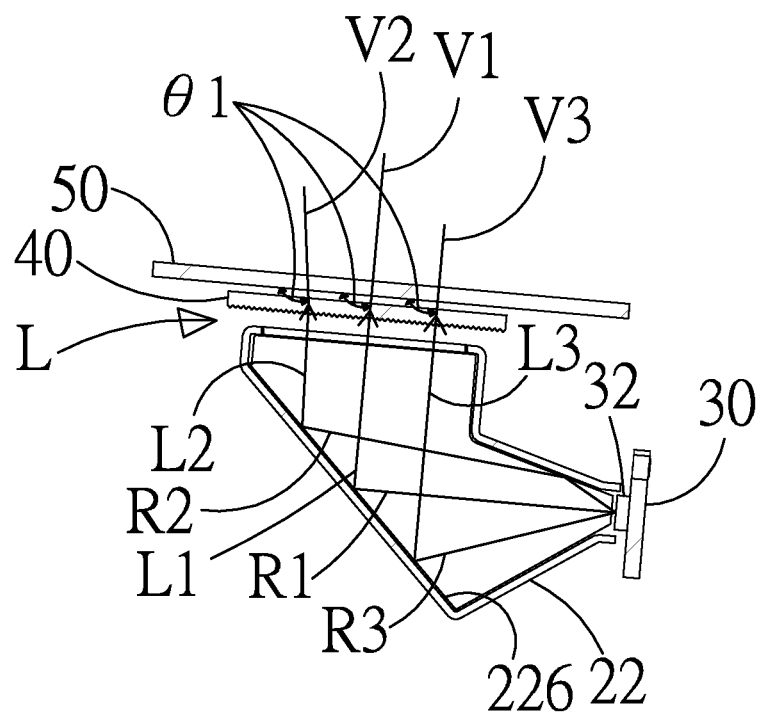
FIG. 3F shows a partial enlarged view of FIG. 3E.

As shown in FIG. 3F, the rays from the light-emitting elements 32 reflected by the reflection surface 226 to the display panel 50 are opposing to the light-emitting side 20B. The incident angle θ1 of the rays from the light-emitting elements 32 reflected by the reflection surface 226 to the display panel 50 is between 80 to 100 degrees. Preferably, the incident angle θ1 is 90 degrees. As shown in FIG. 3B and FIG. 3C, the back-light device 10 further comprises a heat sink structure 58 disposed on the back-light plate 30 and located on one side of the back-light plate 30. According to the present embodiment, the heat sink structure 58 is also disposed on the housing 52 and located on the first side 52A of the housing 52. The heat sink structure 58 has a plurality of heat-dissipating fins 582. The display panel 50 and the heat sink structure 58 are located along a longitudinal direction X. The heat sink structure 58 extends toward the longitudinal direction X. In other words, the installation direction of the heat-dissipating fins 582 is the longitudinal direction X.

The heat sink structure 58 according to the present embodiment is a structure made of metals, for example, aluminum alloy. Nonetheless, the present invention is not limited to aluminum alloy; the heat sink structure 58 may be further made of other metal alloys. As shown in FIG. 3B and FIG. 3C, the display panel 50 has a display area D. The light outlet 224 of the reflection structure 20 corresponds to the whole display area D. Thereby, only one reflection structure 20 according to the present invention is required to provide the back-light source L for the display panel 50, namely, the first emitting ray L1, the second emitting ray L2, and the third emitting ray L3. Thereby, the first incident ray V1, the second incident ray V2, and the third incident ray V3 passing through the display panel 50 have the incident angle θ1. The incident angle θ1 is between 80 and 100 degrees. Preferably, the incident angle θ1 is 90 degrees. The incident angle θ1 described above relatively complies with the arrangement of the liquid crystals in the display panel 50 and hence increasing the optical performance of the back-light source L provided to the display panel 50. That is to say, the optical performance of the first incident ray V1, the second incident ray V2, and the third incident ray V3 are enhanced. Consequently, it is not required to use the light-emitting elements 32 with higher power, for example, high power LEDs, to produce light and the power consumption of the back-light device 10 may be lowered.

Figure 4A:
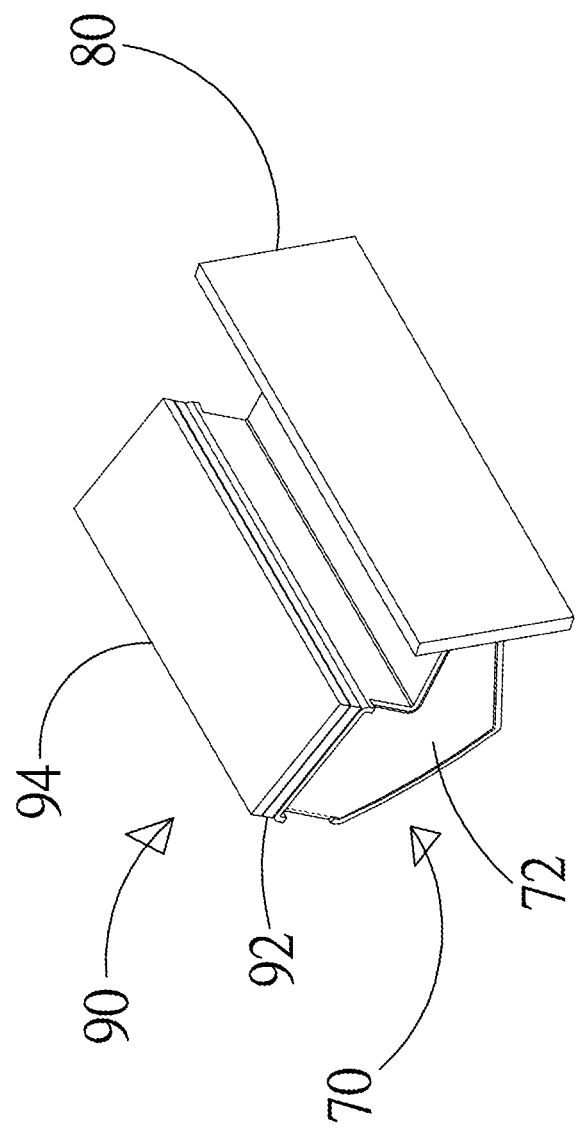
FIG. 4A shows a stereoscopic diagram according to another embodiment of the present invention.
Figure 4B:
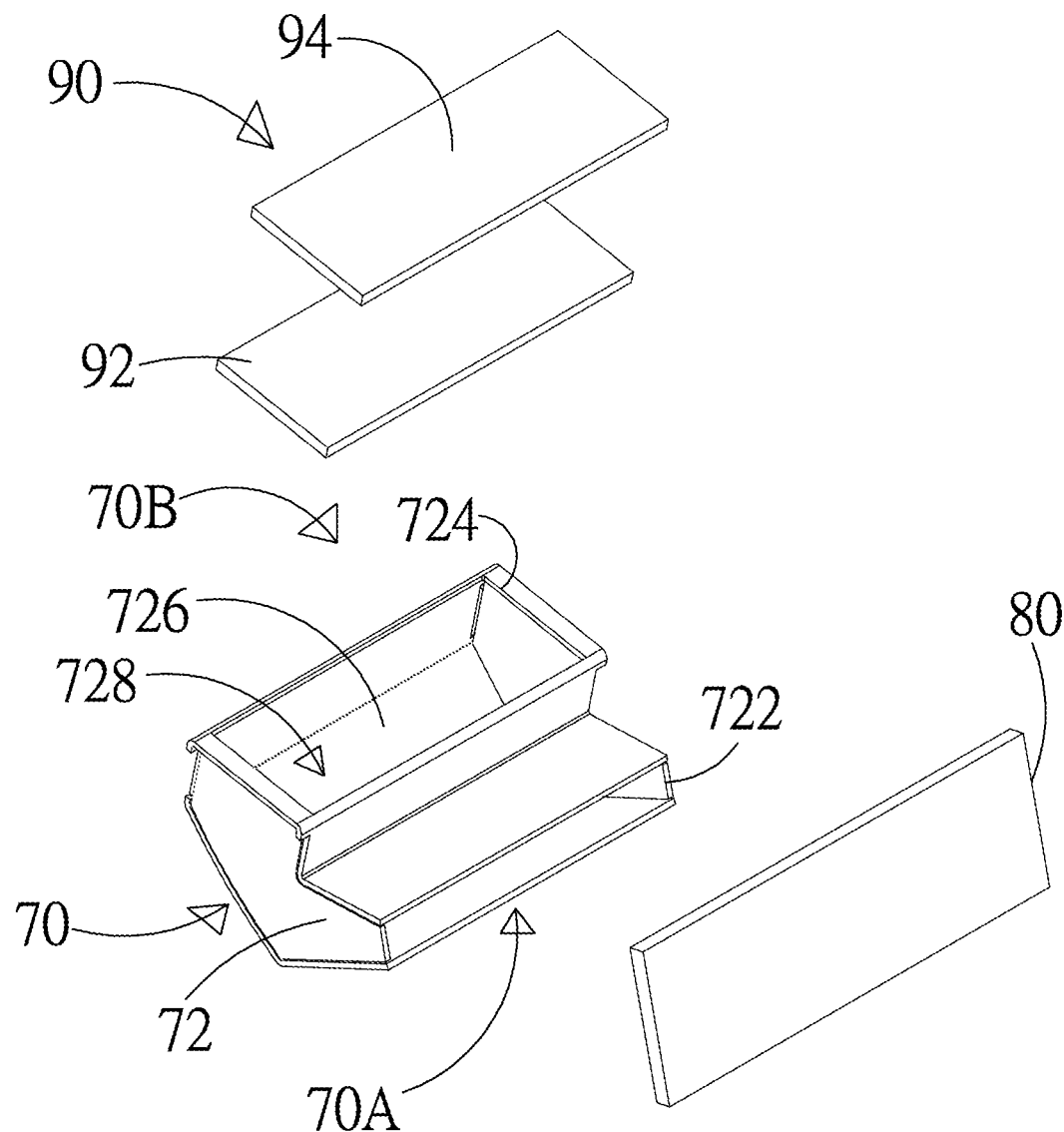
FIG. 4B shows an exploded view according to another embodiment of the present invention.
Figure 4C:
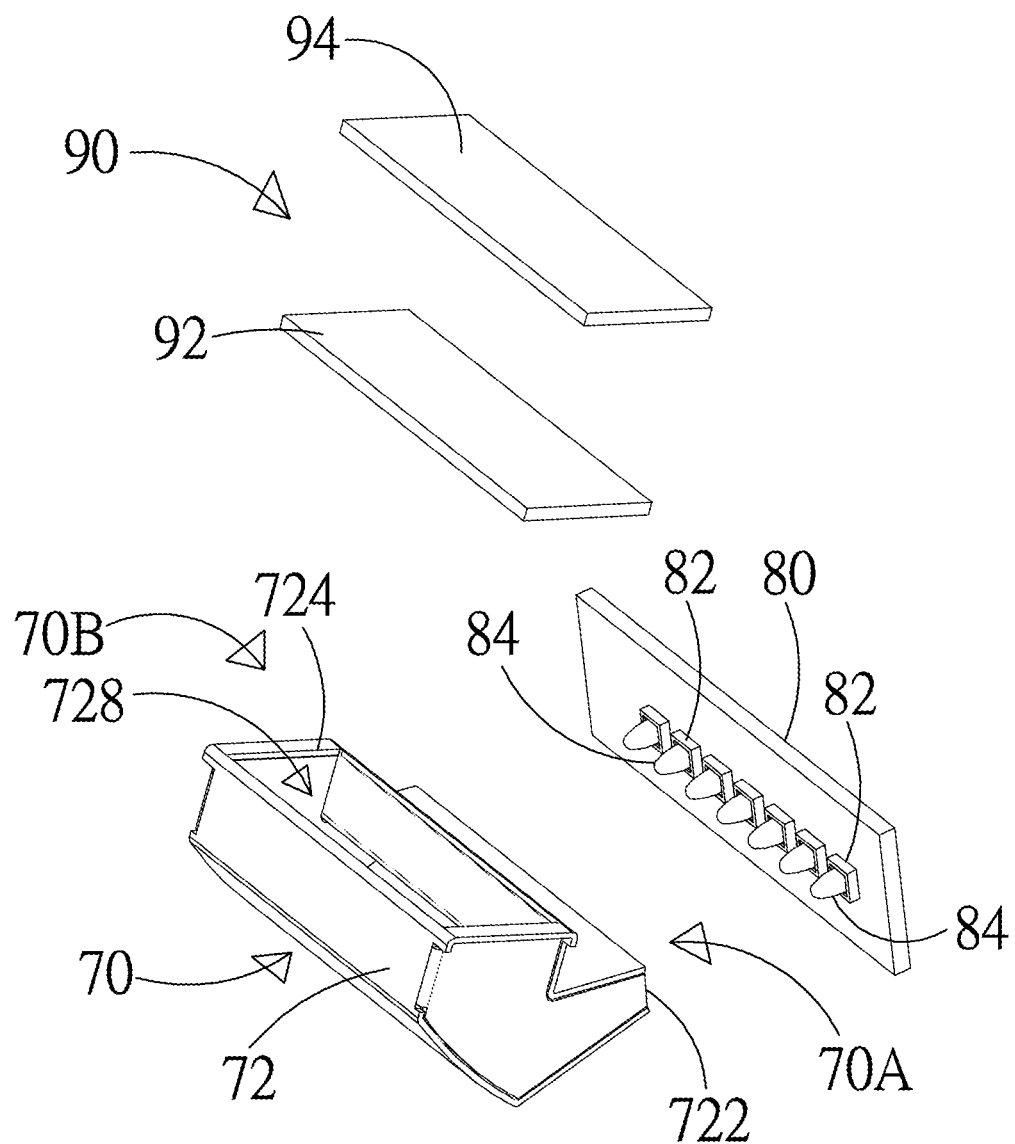
FIG. 4C shows another exploded view according to another embodiment of the present invention.

As shown in FIG. 4A to FIG. 4C, the present invention discloses another back-light device 60, which comprises a reflection structure 70 and a back-light plate 80. The reflection structure 70 includes a light collecting hood 72. The light collecting hood 72 according to the present embodiment has a light inlet 722 located on the light-entering side 70A and a light outlet 724 located on the light-emitting side 70B. In addition to a plurality of light-emitting elements 82 disposed on the back-light plate 80, a plurality of optical elements 84 are disposed on the back-light plate 80. The optical elements 84 are disposed on the light-emitting elements 82. The light-emitting elements 82 and the optical elements 84 disposed on the back-light plate 80 are located on the light-entering side 70A. When the back-light plate 80 is disposed at the reflection structure 70, the light-emitting elements 82 and the optical elements 84 are further located at the light inlet 722. Thereby, the light-emitting angle θ2 of the rays from the light-emitting elements 82 is narrowed due to the rays from the light-emitting elements 82 passing through the optical elements 84. The rays enter the light collecting hood 72 of the reflection structure 70 via the light inlet 722 located on the light-entering side 70A. The reflection surface 726 in the light colleting hood 72 reflects the rays to the light outlet 724.

The light inlet 722 and the light outlet 724 according to the present embodiment are not parallel. The back-light device 60 according to the present embodiment further comprises a light-outlet optical assembly 90 located on the light-emitting side 70B. Thereby, the back-light source L will pass through the light-outlet optical assembly 80 including a light diffuser 92 and a light collecting member 94. The light diffuser 92 is located on the light-emitting side 70B. The light collecting member 94 is disposed on the light diffuser 92. The light diffuser 92 is an optical diffusion film. The light collecting member 94 is a condensing lens or a Fresnel lens. The optical elements 84 are optical glue, transparent high-polymer materials, or transparent package materials formed in the shape of artillery shells. The above is an example according to the present embodiment. Furthermore, the optical elements 84 may be other geometric shapes, such as a half ellipse or a semicircle, capable of narrowing the light-emitting angle θ2.

Figure 5A:
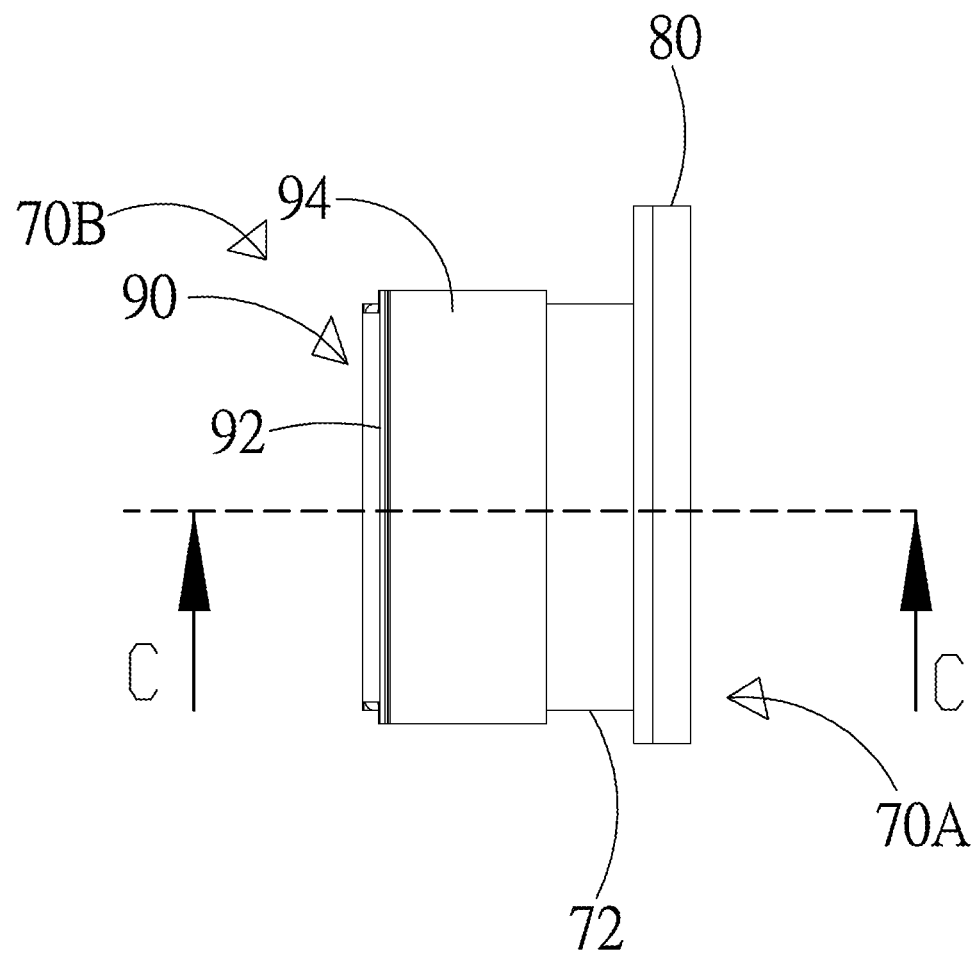
FIG. 5A shows a top view according to another embodiment of the present invention.
Figure 5B:
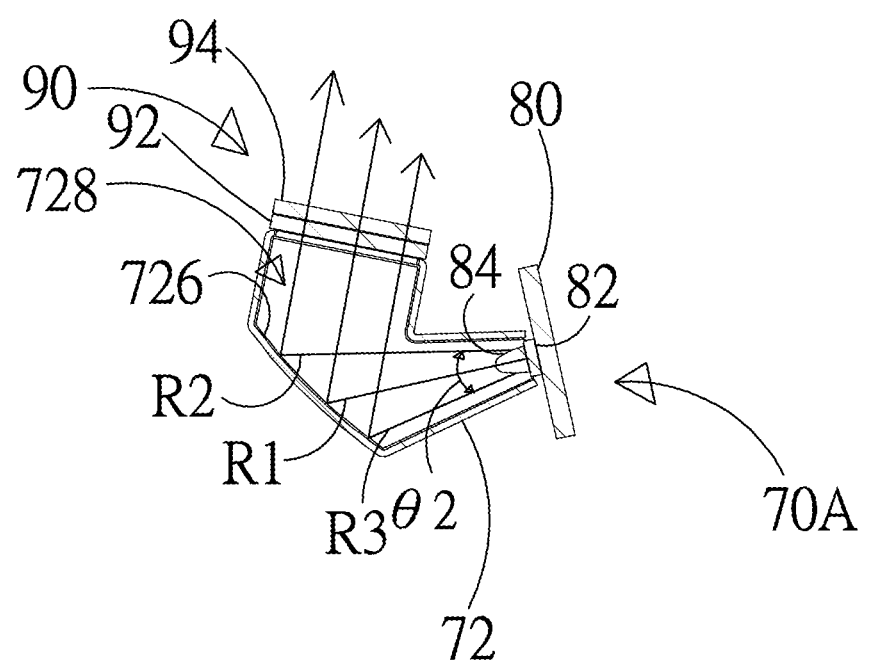
FIG. 5B shows a cross-sectional view along the line CC in FIG. 5A.

As shown in FIG. 5A and FIG. 5B, the light-emitting angle θ2 of the first ray R1, the second ray R2, and the third ray R3 produced by the light-emitting elements 82 disposed on the back-light plate 80 in the back-light device 60 is narrowed by the optical elements 84. Then, the rays passing through the optical elements 84 enter the light collecting hood 72 via the light inlet 722 located on the light-entering side 70A. The first ray R1, the second ray R2, and the third ray R3 passing through the light inlet 722 are concentrated on the reflection surface 726 by the optical elements 84 narrowing the light-emitting angle θ2 of the first ray R1, the second ray R2, and the third ray R3 for reflecting the first ray R1, the second ray R2, and the third ray R3 to the light outlet 724 located on the light-emitting side 70B to form the back-light source L. Since the optical elements 84 narrow the light-emitting angle θ2 of the rays from the light-emitting elements 82 to concentrate the rays on the reflection surface 726, the efficiency of the back-light source L may be improved. Thereby, given the same brightness condition, the power consumption of the back-light device 60 may be further lowered. Besides, the light-outlet optical assembly 90 will adjust the optical path of the back-light source L, and thus enhancing luminance and uniformity. The reflection surface 726 is a reflection mirror or a cylindrical surface for reflecting the rays from the light-emitting elements 82 to the light-emitting side 70B. Furthermore, the reflection surface 226 may be a cylindrical mirror.

Figure 6A:
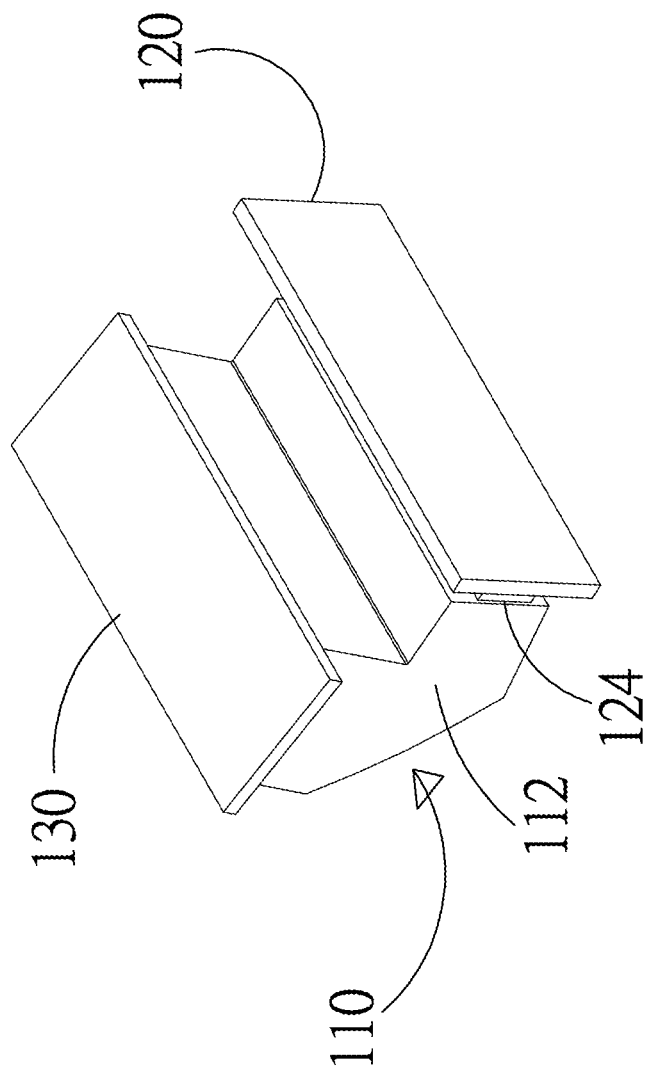
FIG. 6A shows a stereoscopic diagram according to another embodiment of the present invention.
Figure 6B:
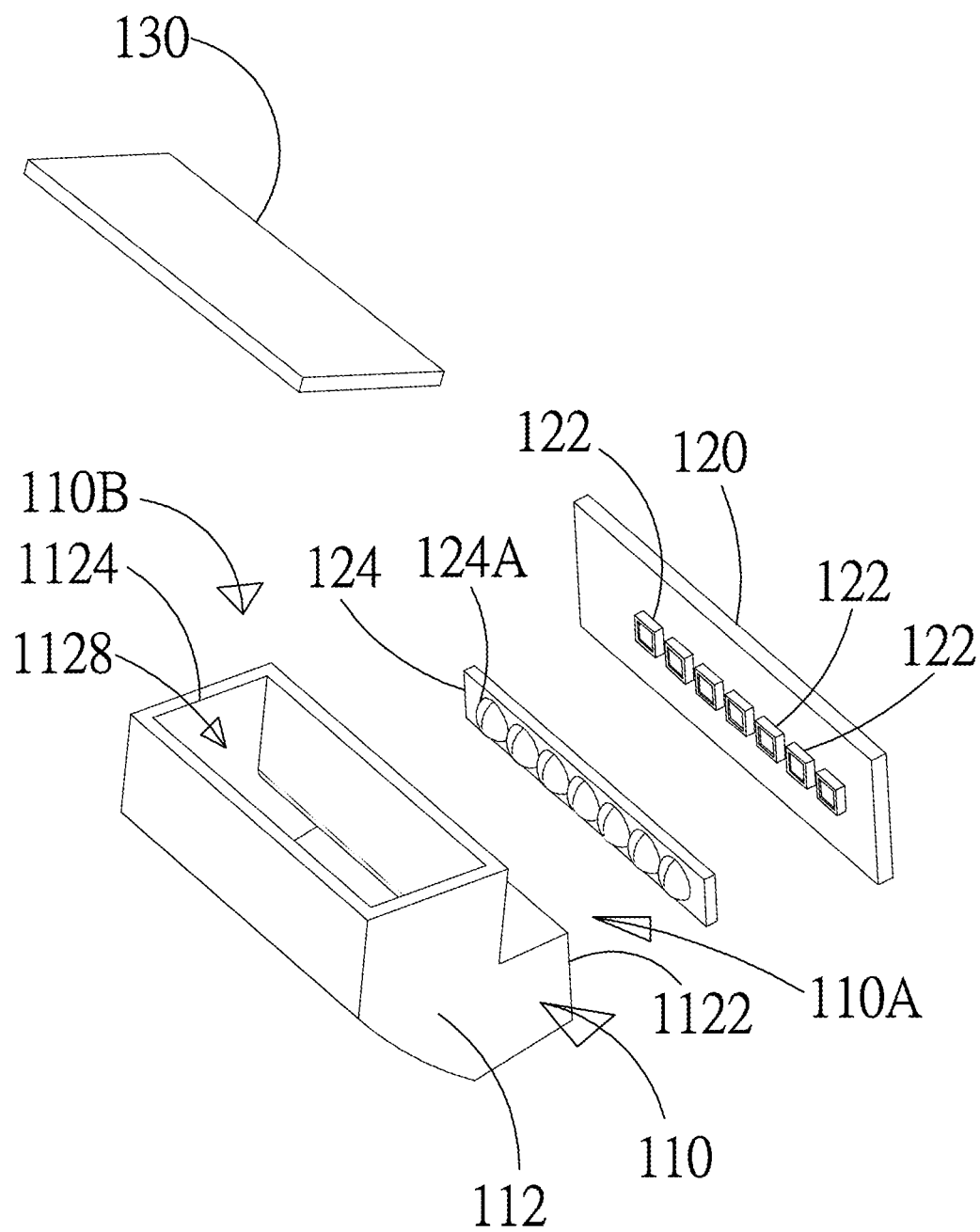
FIG. 6B shows an exploded view according to another embodiment of the present invention.

As shown in FIG. 6A and FIG. 6B, the present invention further discloses a back-light device 100, which comprises a reflection structure 110 and a back-light plate 120. The reflection structure 110 includes a light collecting hood 112. The light collecting hood 112 includes a light inlet 1122 located on the light-entering side 110A and a light outlet 1124 located on the light-emitting side 110B. In addition to a plurality of light-emitting elements 122 disposed on the back-light plate 120, a lens assembly 124 is disposed between the back-light plate 120 and the reflection structure 110. The lens assembly 124 includes a plurality of lenses 124A opposing to the light-emitting elements 122. The lenses 124A and the light-emitting elements 122 are located on the light-entering side 110A. When the back-light plate 120 is disposed at the reflection structure 110, the light-emitting elements 122 and the lenses 124A are further located at the light inlet 1122. Thereby, the light-emitting angle θ3 of the rays from the light-emitting elements 122 is narrowed due to the rays from the light-emitting elements 122 passing through the lenses 124A. The rays, which the light-emitting angle θ3 is narrowed, enter the light collecting hood 112 of the reflection structure 110 via the light inlet 1122 located on the light-entering side 110A. The reflection surface 1126, as shown in FIG. 7B, in the light colleting hood 112 reflects the rays to the light-emitting side 110B. The back-light device 100 according to the present embodiment further comprises a light-outlet optical assembly 130 located on the light-emitting side 110B. Hence, the back-light source L will pass through the light-outlet optical assembly 130. Since the reflection structure 110 reflects the rays and changes their optical paths, their optical paths are equivalent bent. Thereby, the light inlet 1122 and the light outlet 124 are disposed unparallelly.

Figure 7A:
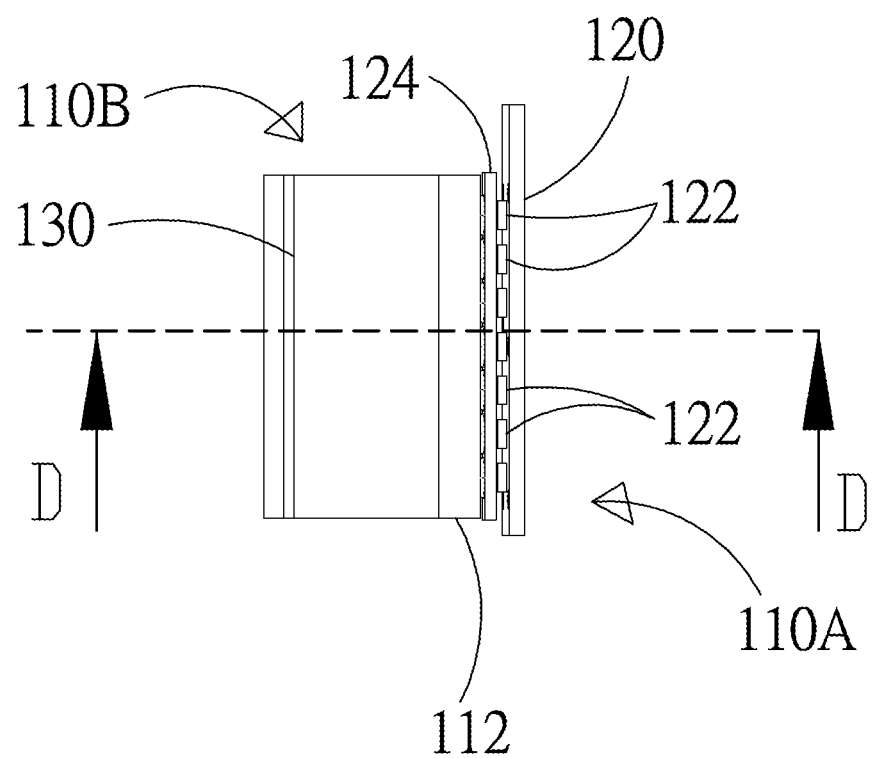
FIG. 7A shows a top view according to another embodiment of the present invention.
Figure 7B:
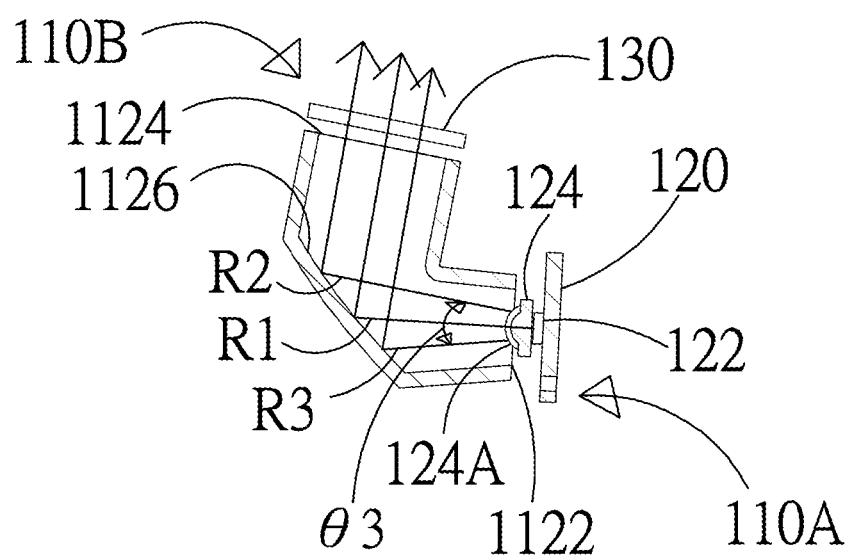
FIG. 7B shows a cross-sectional view along the line DD in FIG. 7A.

As shown in FIG. 7A and FIG. 7B, the light-emitting angle θ3 of the first ray R1, the second ray R2, and the third ray R3 produced by the light-emitting elements 122 disposed on the back-light plate 120 in the back-light device 100 is narrowed by the lenses 124A. Then, the rays passing through the lenses 124A enter the light collecting hood 112 via the light inlet 722 located on the light-entering side 110A. The first ray R1, the second ray R2, and the third ray R3 passing through the light inlet 1122 are concentrated on the reflection surface 1126 by the lenses 124A narrowing the light-emitting angle θ3 of the first ray R1, the second ray R2, and the third ray R3 for reflecting the first ray R1, the second ray R2, and the third ray R3 to the light outlet 1124 located on the light-emitting side 110B to form the back-light source L. Since the lenses 124A narrow the light-emitting angle θ3 of the rays from the light-emitting elements 122 to concentrate the rays on the reflection surface 1126, the efficiency of the back-light source L may be, improved. Thereby, given the same brightness condition, the power consumption of the back-light device 100 may be further lowered. Besides, the light-outlet optical assembly 130 will adjust the optical path of the back-light source L, and thus enhancing luminance and uniformity. The reflection surface 1126 is a reflection mirror or a cylindrical surface for reflecting the rays from the light-emitting elements 122 to the light-emitting side 110B. Furthermore, the reflection surface 1126 may be a cylindrical mirror; the lenses 124A are curved lenses.

To sum up, the back-light device according to the present invention is applied to providing a back-light source to a display panel. By using the reflection surface of the light collecting hood in the reflection structure, the rays entering the light-entering side are reflected to the light outlet for providing the back-light source to the display panel. The rays are further provided to an optical imaging device for projecting images. By further adopting the optical elements and the lens assembly, the light-emitting angles of the rays from the light-emitting elements disposed on the back-light plate may be narrowed and thus enhancing the efficiency of the back-light source.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A back-light device, providing a back-light source to a display panel, comprising:
    a reflection structure, including a light-entering side and a light-emitting side;
    a back-light plate, located at said light-entering side, a plurality of light-emitting elements disposed on said back-light plate and facing said light-entering side; and
    a lens assembly, disposed between said back-light plate and said reflection structure, including a plurality of lenses opposing to said light-emitting elements, and narrowing a light-emitting angle of the rays from said light-emitting elements to be concentrated on a reflection surface of said reflection structure through said lenses, and said reflection surface reflecting the rays from said light-emitting elements to said light-emitting side for forming said back-light source.

2. The back-light device of claim 1, wherein said light-entering side and said light-emitting side are in different locations.

3. The back-light device of claim 1, wherein said reflection structure includes a light collecting hood, including a light inlet, a light outlet, and an optical pathway; said optical pathway is located between said light inlet and said light outlet; said light inlet is located on said light-entering side; said light-emitting elements faces said light inlet; and said light outlet is located on said light-emitting side.

4. The back-light device of claim 3, wherein said light collecting hood includes said reflection surface reflecting the rays from said light-emitting elements to said light outlet.

5. The back-light device of claim 4, wherein said reflection surface is a reflection mirror reflecting the rays from said light-emitting elements to said light outlet.

6. The back-light device of claim 4, wherein said reflection surface is a cylindrical surface reflecting the rays from said light-emitting elements to said light outlet.

7. The back-light device of claim 1, wherein the incident angle of the rays from said light-emitting elements reflected by said reflection surface emitting on said light-emitting side to said display panel is between 80 and 100 degrees.

8. The back-light device of claim 1, wherein said lenses are curved lenses.

9. The back-light device of claim 1, further comprising a light-outlet optical assembly located on said light-emitting side.

10. The back-light device of claim 9, wherein said light-outlet optical assembly includes:
    a light diffuser, disposed on said light-emitting side; and
    a light collecting member, disposed on said light diffuser.

11. The back-light device of claim 1, further comprising a heat sink structure, disposed on said back-light plate and located on one side of said back-light plate, and including a plurality of heat-dissipating fins.

12. The back-light device of claim 11, wherein said display panel is located along a longitudinal direction and said heat sink structure extends along said longitudinal direction.

13. The back-light device of claim 1, wherein said display panel includes a display area; said reflection structure includes a light outlet located on said light-emitting side; and said light outlet corresponds to the whole of said display area.

14. A back-light device, providing a back-light source to a display panel, comprising:
    a reflection structure, including a light-entering side and a light-emitting side;
    a back-light plate, located at said light-entering side, a plurality of light-emitting elements disposed on said back-light plate and facing said light-entering side; and
    a plurality of optical elements disposed on said light-emitting elements and narrowing a light-emitting angle of the rays from said light-emitting elements to be concentrated on a reflection surface of said reflection structure through said optical elements, and said reflection surface reflecting the rays from said light-emitting elements to said light-emitting side for forming said back-light source.

15. The back-light device of claim 14, wherein said optical elements are formed in a geometric shape of an artillery shell, a half ellipse or a semicircle.

* * * * *